US011769046B2

(12) United States Patent
Cohen (10) Patent No.: US 11,769,046 B2
(45) Date of Patent: Sep. 26, 2023

(54) SYMMETRIC PHASE-CHANGE MEMORY DEVICES

(71) Applicant: INTERNATIONAL BUSINESS MACHINES CORPORATION, Armonk, NY (US)

(72) Inventor: Guy M. Cohen, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 934 days.

(21) Appl. No.: 16/353,504

(22) Filed: Mar. 14, 2019

(65) Prior Publication Data

US 2020/0293880 A1 Sep. 17, 2020

(51) Int. Cl.
*G06N 3/08* (2023.01)
*G11C 13/00* (2006.01)
*G11C 11/54* (2006.01)
*H10N 70/00* (2023.01)

(52) U.S. Cl.
CPC ............... *G06N 3/08* (2013.01); *G11C 11/54* (2013.01); *G11C 13/003* (2013.01); *G11C 13/0004* (2013.01); *H10N 70/8828* (2023.02); *G11C 2213/79* (2013.01)

(58) Field of Classification Search
CPC ........ G06N 3/084; G06N 3/0635; G06N 3/08; G06N 3/0454; G06N 3/04; H10N 70/231; H10N 70/8828; H10N 70/826; H10N 70/882; H10N 70/063
See application file for complete search history.

(56) References Cited

U.S. PATENT DOCUMENTS

| 6,502,083 | B1 | 12/2002 | Louis et al. |
| 8,712,940 | B2 | 4/2014 | Modha |
| 9,715,656 | B1 | 7/2017 | Gokmen |
| 9,779,805 | B2* | 10/2017 | Pellizzer ............. G11C 11/5678 |
| 9,934,838 | B1 | 4/2018 | Han et al. |
| 2013/0181183 | A1* | 7/2013 | Pellizzer ............... H01L 45/144 |
| | | | 257/E21.52 |
| 2017/0109626 | A1 | 4/2017 | Gokmen et al. |
| 2018/0114572 | A1 | 4/2018 | Gokmen et al. |
| 2018/0225567 | A1 | 8/2018 | Bedell et al. |
| 2018/0253642 | A1 | 9/2018 | Gokmen et al. |
| 2022/0029094 | A1* | 1/2022 | Song ................... H01L 45/1246 |

OTHER PUBLICATIONS

Tayfun Gokmen et al., "Acceleration of Deep Neural Network Training with Resistive Cross-Point Devices: Design Considerations", Front. Neurosci., Jul. 2016.
Shogo Hatayama et al., "Inverse Resistance Change Cr2Ge2Te6-Based PCRAM Enabling Ultralow-Energy Amorphization", ACS Appl. Mater. Interfaces, Jan. 2018.
Y. Shuang et al., "Contact resistance change memory using N-doped Cr2Ge2Te6 phase-change material showing non-bulk resistance change", Appl. Phys. Lett., May 2018.

* cited by examiner

*Primary Examiner* — Tony Tran
(74) *Attorney, Agent, or Firm* — Tutunjian & Bitetto, P.C.; Randy Emilio Tejeda (57) ABSTRACT

Variable resistance devices and neural network processing systems include a first phase change memory device that has a first material that increases resistance when a set pulse is applied. A second phase change memory device has a second material that decreases resistance when a set pulse is applied.

18 Claims, 7 Drawing Sheets

FIG. 1

(Prior art)

FIG. 8

SYMMETRIC PHASE-CHANGE MEMORY DEVICES

BACKGROUND

Technical Field

The present invention generally relates to phase change memory devices and, more particularly, to the use of phase change variable resistance devices as resistive processing units.

Description of the Related Art

An artificial neural network (ANN) is an information processing system that is inspired by biological nervous systems, such as the brain. The key element of ANNs is the structure of the information processing system, which includes a large number of highly interconnected processing elements (called "neurons") working in parallel to solve specific problems. ANNs are furthermore trained in-use, with learning that involves adjustments to weights that exist between the neurons. An ANN is configured for a specific application, such as pattern recognition or data classification, through such a learning process.

Figure 1:
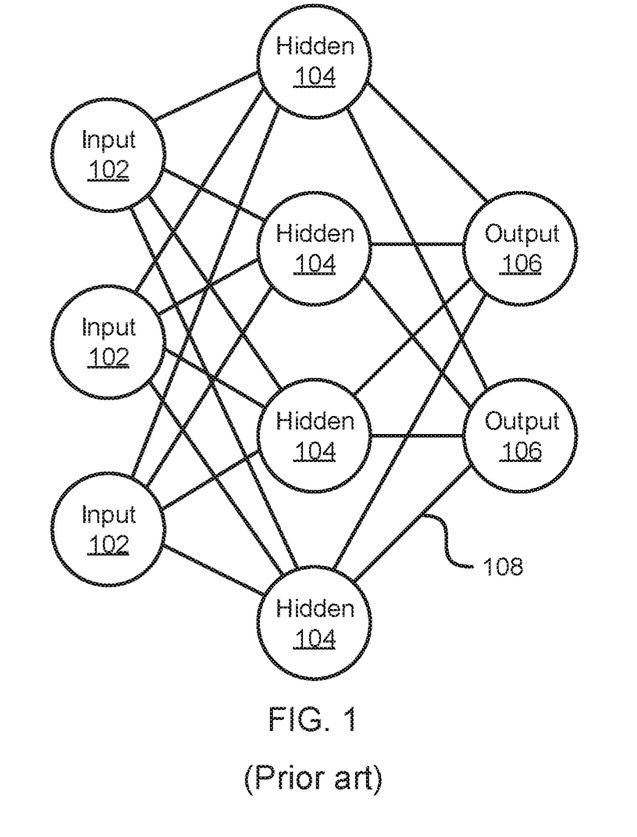
FIG. 1 is a diagram of an exemplary neural network.

Referring now to FIG. 1, a generalized diagram of a neural network is shown. ANNs demonstrate an ability to derive meaning from complicated or imprecise data and can be used to extract patterns and detect trends that are too complex to be detected by humans or other computer-based systems. The structure of a neural network is known generally to have input neurons 102 that provide information to one or more "hidden" neurons 104. Connections 108 between the input neurons 102 and hidden neurons 104 are weighted and these weighted inputs are then processed by the hidden neurons 104 according to some function in the hidden neurons 104, with weighted connections 108 between the layers. There can be any number of layers of hidden neurons 104, and as well as neurons that perform different functions. There exist different neural network structures as well, such as convolutional neural network, maxout network, etc. Finally, a set of output neurons 106 accepts and processes weighted input from the last set of hidden neurons 104.

This represents a "feed-forward" computation, where information propagates from input neurons 102 to the output neurons 106. Upon completion of a feed-forward computation, the output is compared to a desired output available from training data. The error relative to the training data is then processed in "feed-back" computation, where the hidden neurons 104 and input neurons 102 receive information regarding the error propagating backward from the output neurons 106. Once the backward error propagation has been completed, weight updates are performed, with the weighted connections 108 being updated to account for the received error. This represents just one variety of ANN.

SUMMARY

A variable resistance device includes a first phase change memory device that has a first material that increases resistance when a set pulse is applied. A second phase change memory device has a second material that decreases resistance when a set pulse is applied.

A neural network processing system includes a first layer of one or more first neurons and a second layer of one or more second neurons. An array of weights accepts a voltage output by the first layer and outputs a current to the second layer. Each weight in the array of weights includes a first phase change memory device that has a first material that increases resistance when a set pulse is applied and a second phase change memory device that has a second material that decreases resistance when a set pulse is applied.

A neural network processing system includes a first layer of one or more first neurons and a second layer of one or more second neurons. An array of weights accepts a voltage output by the first layer and outputs a current to the second layer. Each weight in the array of weights includes a first phase change memory device that has a first material that increases resistance when a set pulse is applied and a second phase change memory device that has a second material that decreases resistance when a set pulse is applied. The first phase change memory device and the second phase change memory device are connected in series to a bitline. A first bypass switch of each weight is configured to short-circuit the first phase change memory device when enabled and a second bypass switch of each weight is configured to short-circuit the second phase change memory device when enabled. The first bypass switch and second bypass switch are connected to a wordline.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide variable resistive devices that are well suited for use as synapses in hardware artificial neural networks (ANNs). The variable resistive devices can be used to store a continuous state as a resistance, with readout being performed using a lowcurrent and with the resistance being selected through medium-current pulses, so that the variable resistive devices can be used as resistive processing units (RPUs). The present embodiments particularly form such RPUs using two distinct variable resistive cells, providing the ability to increase or decrease the resistance of the RPU as needed.

Phase change memory cells generally provide the ability to change the resistance of the cell by changing the phase of the cell. The cell starts in a first phase (e.g., an amorphous phase) and is progressively changed to a second phase (e.g., a crystalline phase). The two phases exhibit different resistances, so as the proportion of the cell in each phase changes, so too does the resistance of the cell. Each cell thus provides the ability to continuously change the resistance of the cell from its initial value, when it is in its initial phase, to a final value, when it is in its second phase.

However, each phase change memory cell can only be adjusted continuously in a single direction. Each setting pulse can crystallize more of the phase change memory cell until the entire unit is in its second phase (e.g. crystalline phase). To change the resistance in the other direction, the phase change memory cell is reset back to its initial phase (e.g. amorphous phase). This reset can be performed using a melt-quench process where a high-current pulse is applied to melt the phase change material, and then the current pulse is abruptly stopped so the molten material quickly cools, preventing recrystallization.

Because each phase change memory cell can only provide continuous adjustments by changing the material state from the amorphous phase to the crystalline phase, where the reversed process is always abrupt, the present embodiments employ at least two phase change memory cells which are connected in series to implement an RPU which can be adjusted continuously. One of the phase change memory cells is formed with a first material that provides an increase in resistivity when the cell is adjusted continuously from amorphous to crystalline phase. The other cell is formed with a second material that provides a decrease in resistivity when the cell is adjusted continuously from amorphous to crystalline phase. The resistance of the RPU is thus the sum of the two phase change memory cells. Thus, by adjusting one resistance or the other, the total resistance can be increased or decreased continuously as needed.

As is described below, this bidirectional adjustment ability makes the RPUs well-suited to use in ANNs. Although the present embodiments are described with particular attention to embodiments that employ the RPUs as weights in an ANN, it should be understood that the present embodiments can be used in any application that calls for a variable resistor, as the symmetric adjustability makes the RPUs functional potentiometers. Additionally, the RPUs can be used as memory devices, where a value is stored as the resistance value of the RPU. The terms "symmetric" and "bidirectional" are used interchangeably herein to refer to the RPU resistance's positive and negative adjustability.

Figure 2:
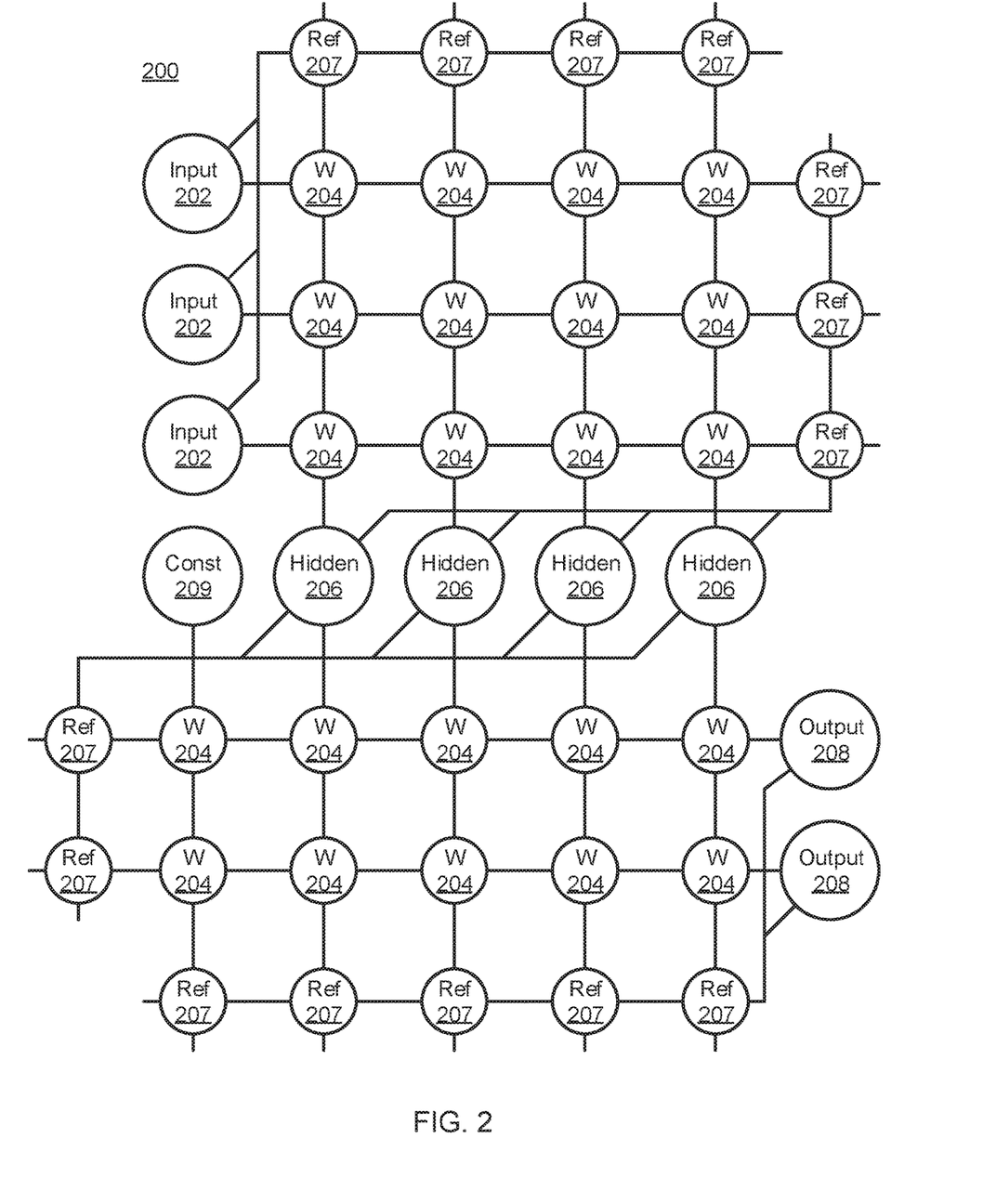
FIG. 2 is a diagram of an exemplary neural network that uses resistive processing units in accordance with an embodiment of the present invention.

Referring now to the drawings in which like numerals represent the same or similar elements and initially to FIG. 2, an artificial neural network (ANN) architecture 200 is shown. It should be understood that the present architecture is purely exemplary and that other architectures or types of neural network can be used instead. In particular, while a hardware embodiment of an ANN is described herein, it should be understood that neural network architectures can be implemented or simulated in software. The hardware embodiment described herein is included with the intent of illustrating general principles of neural network computation at a high level of generality and should not be construed as limiting in any way.

Furthermore, the layers of neurons described below and the weights connecting them are described in a general manner and can be replaced by any type of neural network layers with any appropriate degree or type of interconnectivity. For example, layers can include convolutional layers, pooling layers, fully connected layers, stopmax layers, or any other appropriate type of neural network layer. Furthermore, layers can be added or removed as needed and the weights can be omitted for more complicated forms of interconnection.

During feed-forward operation, a set of input neurons 202 each provide an input voltage in parallel to a respective row of weights 204. In the hardware embodiment described herein, the weights 204 each have a settable resistance value, such that a current output flows from the weight 204 to a respective hidden neuron 206 to represent the weighted input. In software embodiments, the weights 204 can simply be represented as coefficient values that are multiplied against the relevant neuron outputs.

Following the hardware embodiment, the current output by a given weight 204 is determined as $$I = \frac{V}{R},$$

where V is the input voltage from the input neuron 202 and R is the set resistance of the weight 204. The current from each weight adds column-wise and flows to a hidden neuron 206. A set of reference weights 207 have a fixed resistance and combine their outputs into a reference current that is provided to each of the hidden neurons 206. Because conductance values (G=1/R) can only be positive numbers, some reference conductance is needed to encode both positive and negative values in the matrix. The currents produced by the weights 204 are continuously valued and positive, and therefore the reference weights 207 are used to provide a reference current, above which currents are considered to have positive values and below which currents are considered to have negative values. The use of reference weights 207 is not needed in software embodiments, where the values of outputs and weights can be precisely and directly obtained. As an alternative to using the reference weights 207, another embodiment can use separate arrays of weights 204 to capture negative values.

The hidden neurons 206 use the currents from the array of weights 204 and the reference weights 207 to perform some calculation, such as a threshold function. The hidden neurons 206 then output a voltage of their own to another array of weights 204. This array performs in the same way, with a column of weights 204 receiving a voltage from their respective hidden neuron 206 to produce a weighted current output that adds row-wise and is provided to the output neuron 208.

It should be understood that any number of these stages can be implemented, by interposing additional layers of arrays and hidden neurons 206. It should also be noted that some neurons can be constant neurons 209, which provide a constant output to the array. The constant neurons 209 can be present among the input neurons 202 and/or hidden neurons 206 and are only used during feed-forward operation.

During back propagation, the output neurons 208 provide a voltage back across the array of weights 204. The output layer compares the generated network response to training data and computes an error. The error is applied to the array as a voltage pulse, where the height and/or duration of the pulse is modulated proportional to the error value. In this example, a row of weights 204 receives a voltage from a respective output neuron 208 in parallel and converts that voltage into a current which adds column-wise to provide an input to hidden neurons 206. The hidden neurons 206 combine the weighted feedback signal with a derivative of its feed-forward calculation and stores an error value before outputting a feedback signal voltage to its respective column of weights 204. This back propagation travels through the entire network 200 until all hidden neurons 206 and the input neurons 202 have stored an error value.

During weight updates, the input neurons 202 and hidden neurons 206 apply a first weight update voltage forward and the output neurons 208 and hidden neurons 206 apply a second weight update voltage backward through the network 200. The combinations of these voltages create a state change within each weight 204, causing the weight 204 to take on a new resistance value. In this manner the weights 204 can be trained to adapt the neural network 200 to errors in its processing. It should be noted that the three modes of operation, feed forward, back propagation, and weight update, do not overlap with one another.

As noted above, the weights 204 of an ANN can be implemented in software or in hardware, for example using relatively complicated weighting circuitry or using resistive cross point devices. Such resistive devices can have switching characteristics that have a non-linearity that can be used for processing data. According to the present embodiments, the weights 204 can be phase-change memory RPUs that have bidirectional adjustment capability.

Figure 3:
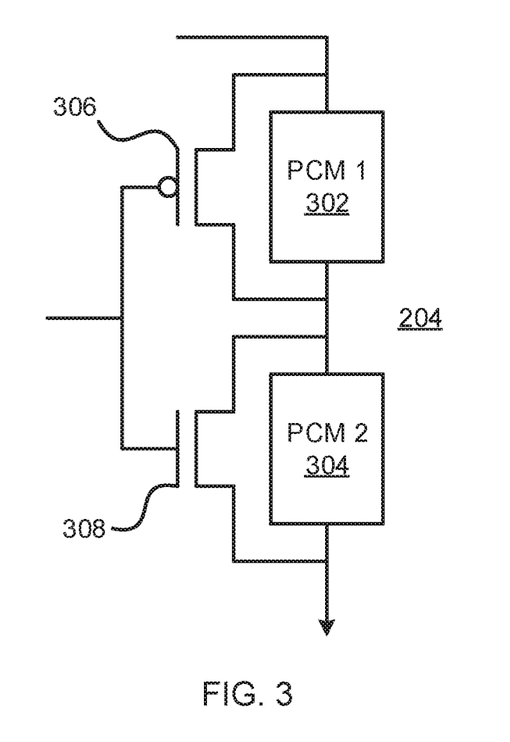
FIG. 3 is a is a schematic diagram of a resistive processing unit that can be continuously changed in resistance in a positive and a negative direction in accordance with an embodiment of the present invention.

Referring now to FIG. 3, a diagram of the structure of an exemplary RPU is shown, which can be used as a weight 204 in an ANN. The RPU 204 includes two phase change memory devices, including a first phase change memory cell 302 and a second phase change memory cell 304. It is specifically contemplated that each phase change memory device has a different composition. In one example, the first phase change memory cell 302 can be formed from a material that increases in resistance as it changes from its first phase to its second phase, while the second phase change memory cell 304 can be formed from a material that decreases in resistance as it changes from its first phase to its second phase. In other embodiments, the first phase change memory cell 302 can be formed from a material that decreases in resistance as it changes from its first phase to its second phase and the second phase change memory cell 304 can be formed from a material that increases in resistance as it changes from its first phase to its second phase. In such alternative embodiments, the switching structures 306 and 308 would also be changed accordingly.

In one particular embodiment, the first phase change memory cell 302 can be formed from a chromium-germanium-tellurium alloy such as, e.g., $Cr_2Ge_2Te_6$, while the second phase change memory cell 304 can be formed from a germanium-antimony-tellurium alloy such as, e.g., $Ge_2Sb_2Te_5$. Alternative materials for the second phase change memory cell 304 include, e.g., $Sb_2Te_3$ and GeTe. As $Cr_2Ge_2Te_6$ changes from its amorphous state to its crystalline state, its resistance increases. As $Ge_2Sb_2Te_5$ changes from its amorphous state to its crystalline state, its resistance decreases. In yet another example, first phase change memory cell 302 can be formed form $Cr_2Ge_2Te_6$, while second phase change memory cell 304 can be formed from $Cr_2Ge_2Te_6$ that contains at least 6.5% nitrogen. In particularly contemplated embodiments, the second phase change memory cell can have about 8% nitrogen.

The first phase change memory cell 302 has a first bypass switch 306 and the second phase change memory cell 304 has a second bypass switch 308. When the RPU is programmed with a set pulse, the memory cell that will not be programed is electrically shorted using the respective bypass switch, while the memory cell that is chosen for programming will have its bypass switch electrically open. For example, when memory cell 302 is selected for programing, bypass switch 306 will be open so all the set pulse current will pass through memory cell 302. At the same time bypass switch 308 will be electrically closed, effectively short-circuiting phase change memory cell 304, so none of the set pulse current, or a negligible amount thereof, flows through cell 304. In this manner, a set current pulse can be applied to the other phase change memory cell to change its resistance state without affecting the bypassed phase change memory cell. Thus, in an example where changes to the first phase change memory cell 302 increase the resistance and where changes to the second phase change memory cell 304 decrease the resistance, the first phase change memory cell 302 can be bypassed using first bypass switch 306 while a medium-current pulse is applied to change the state (and thus decrease the resistance) of the second phase change memory cell 304. It is specifically contemplated that the switches 306 and 308 can be realized using a complementary pair of field effect transistors (FETs), but it should be understood that any appropriate switching device can be used instead. In one particular embodiment, it is contemplated that the first bypass switch 306 can be a p-type FET and that the second bypass switch 308 can be an n-type FET. When the RPU is used in read mode, that is when the RPU's resistance value is determined without making any change to the resistance, a small amplitude current pulse is used. In read mode, both bypass switches 306 and 308 are set to be electrically open so the read current pulse flow through cell 302 and 304 in series. The total RPU resistance is therefore the sum of the resistance of cell 302 and cell 304.

In this manner, the resistance of the weight 204, which is the summed resistance of the two phase change memory cells, can be increased and decreased in any order. An increase in resistance from one phase change memory cell can later be undone by a corresponding decrease in the resistance from the other phase change memory cell. However, each phase change memory cell will have a limit in how much resistance can be changed, which represents being fully converted to its second phase. In some embodiments, where the weights 204 are set during training and then are not changed during operation, the changes to the resistance may never reach the limit for either phase change memory cell. In other embodiments, for example during a particularly long training phase or if the weights are updated during operation, one or both phase change memory cells may eventually reach the end of this resistance range. In this event, both phase change memory cells can be reset with an appropriate high-current pulse. One of the two phase change memory cells can then be adjusted to bring the weight 204 back to its last resistance value before the reset and normal adjustments can resume.

Figure 4:
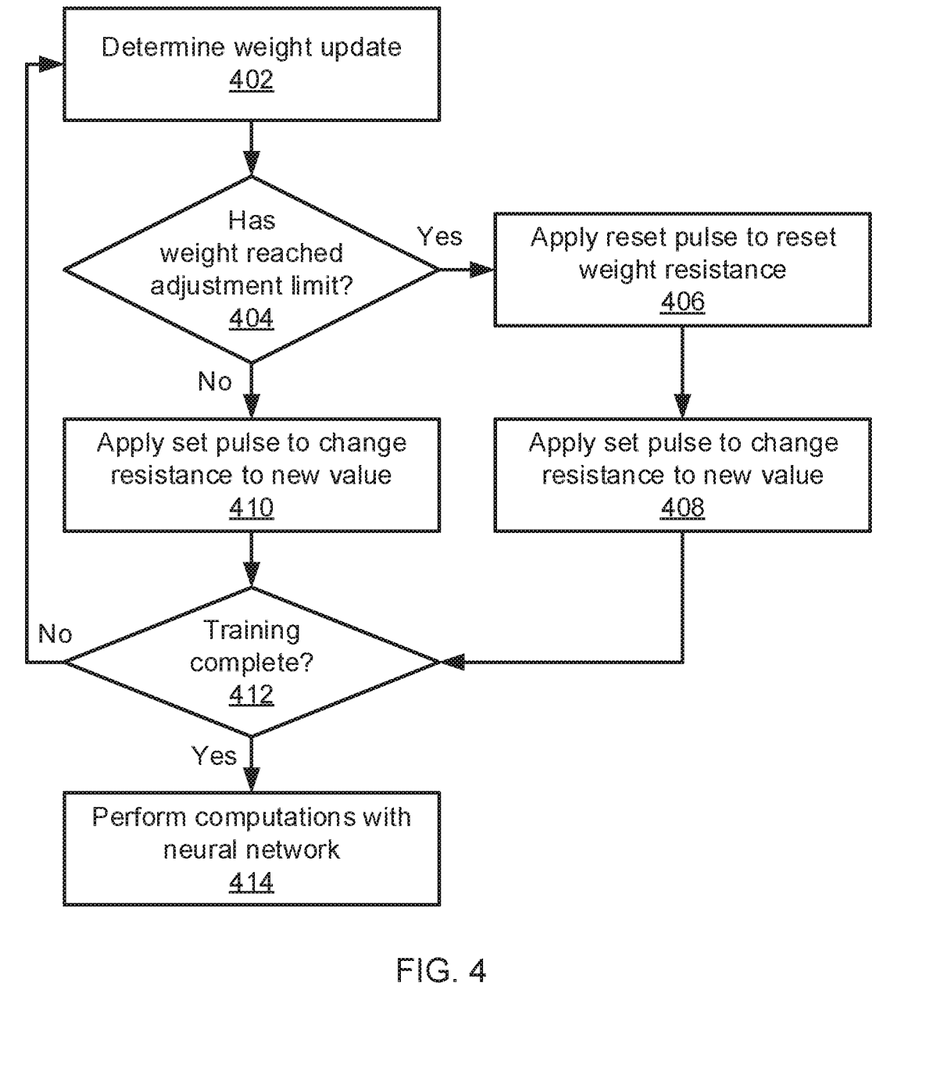
FIG. 4 is a block/flow diagram of a method for training a neural network that uses resistive processing units in accordance with an embodiment of the present invention.

Referring now to FIG. 4, a method for training a weight 204 in an ANN is shown. Block 402 determines a weight update to perform for a particular weight. This weight update may represent an increase or a decrease in the resistance of the weight 204 as called for based on the comparison of the neural network's output to an expected output. Block 404 determines whether the weight update that has been called for in block 402 would cause one of the phase change memory cells in the weight 204 to exceed its resistance adjustment limit (e.g., by causing the phase change memory cell to be fully converted to its second phase).

If the weight update would cause a phase change memory cell to reach or exceed its resistance adjustment limit, block 406 applies a reset pulse to both phase change memory cells, returning both phase change memory cells to their respective first phase states. Block 408 then adjusts one of the phase change memory cells to cause the resistance of the weight 204 to be that dictated by block 402. If the weight update determined by block 402 is within the adjustment range of the phase change memory cells 204, then block 410 adjusts one of the phase change memory cells to increase or decrease the resistance of the weight 204 as appropriate. In either case, the adjustment can be performed by applying a medium-strength current for a duration that is determined by the amount of resistance change. A single phase change memory cell is selected for adjustment by enabling the bypass switch of the other phase change memory cell.

Block 412 then determines whether training is complete. If not, processing returns to block 402 with a new weight update. If training is complete, block 414 uses the trained network to perform computations. The training method described herein can be applied to each weight 204 in the neural network simultaneously or can be performed weight-by-weight or in a batched fashion.

Figure 5:
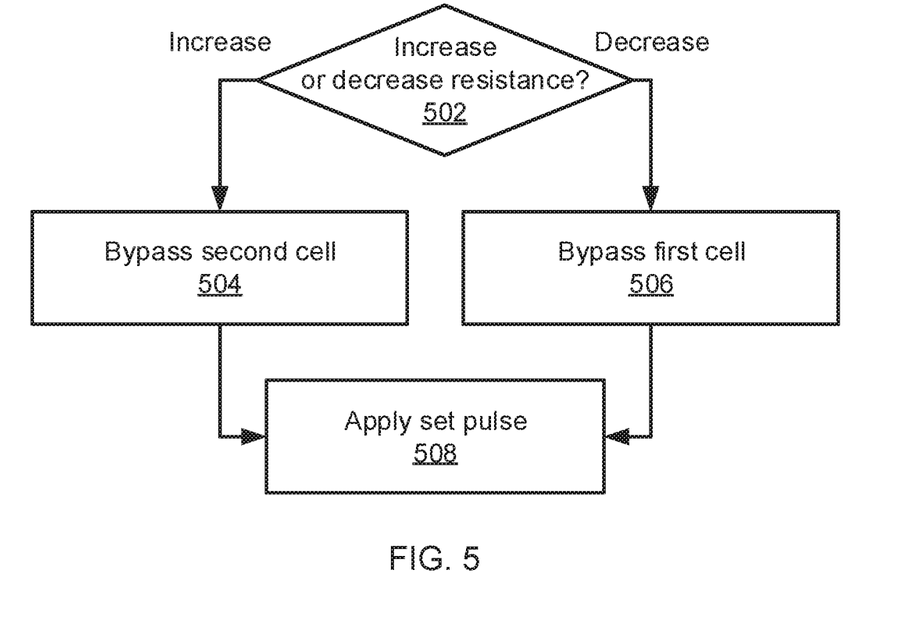
FIG. 5 is a block/flow diagram of a method for changing a resistance value of a resistance processing unit that can be continuously changed in resistance in a positive and a negative direction in accordance with an embodiment of the present invention.

Referring now to FIG. 5, a method for adjusting the resistance of a weight 204 is shown. Block 502 determines whether the weight update calls for an increase or a decrease to the resistance of the weight 204 (e.g., whether a target resistance value is above or below a current resistance value). If the weight update is an increase in resistance, block 504 bypasses the second phase change memory cell 304 using the second bypass switch 308. Block 508 then applies a set current pulse that passes through the first phase change memory cell 302 and increases the resistance thereof by an amount proportional to a duration of the pulse. If the weight update is a decrease in resistance, block 506 bypasses the first phase change memory cell 302 using the first bypass switch 306 and block 508 applies the set current pulse through the second phase change memory cell 302 to decrease the resistance thereof.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 6:
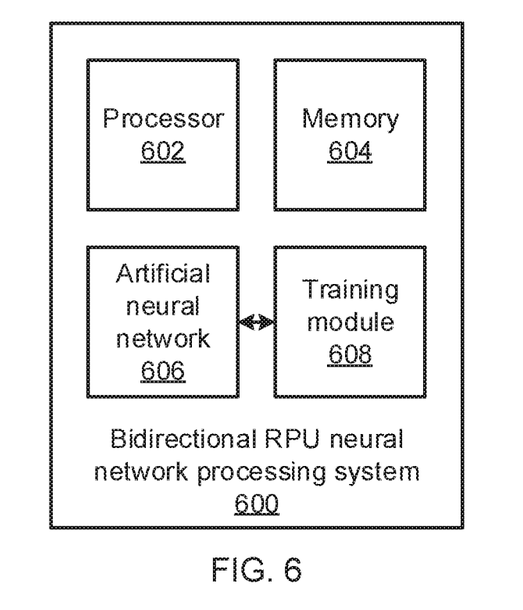
FIG. 6 is a block diagram of a bidirectional resistive processing unit neural network processing system in accordance with an embodiment of the present invention.

Referring now to FIG. 6, a bidirectional RPU neural network processing system 600 is shown. The system 600 includes a hardware processor 602 and a memory 604. The system 600 further includes an artificial neural network 606 that is implemented with bidirectional RPUs formed from phase change memory cells, where the bidirectional RPUs can be adjusted to increase or decrease their resistance. The artificial neural network 606 is thus implemented at least partially in hardware, with hardware weights and appropriate circuitry to provide neuron outputs to the weights and to adjust the weights during training.

The system 600 further includes a neural network training module 608. The training module 608 trains the weights 204 of the neural network 606 by issuing current pulses to the phase change memory cells of the RPUs as described above. It should be understood that the training module 608 can be implemented as a combination of software and hardware components, with logic and control software being stored in the memory 604 and executed by processor 602 and with pulse generating circuitry being implemented in hardware. In other embodiments, the training module 608 can be implemented entirely in hardware in the form of, e.g., an application-specific integrated chip or field programmable gate array.

The training module 608 uses a set of training data that can be stored in, for example, memory 604. The training data is split into parts, with a first part being used to perform training and a second part being used to verify the output of the trained neural network 606. The training module 608 uses discrepancies between the output of the neural network 606 and the expected output to determine weight updates that are used to adjust resistance values of the weights 204 in the neural network 606.

Figure 7:
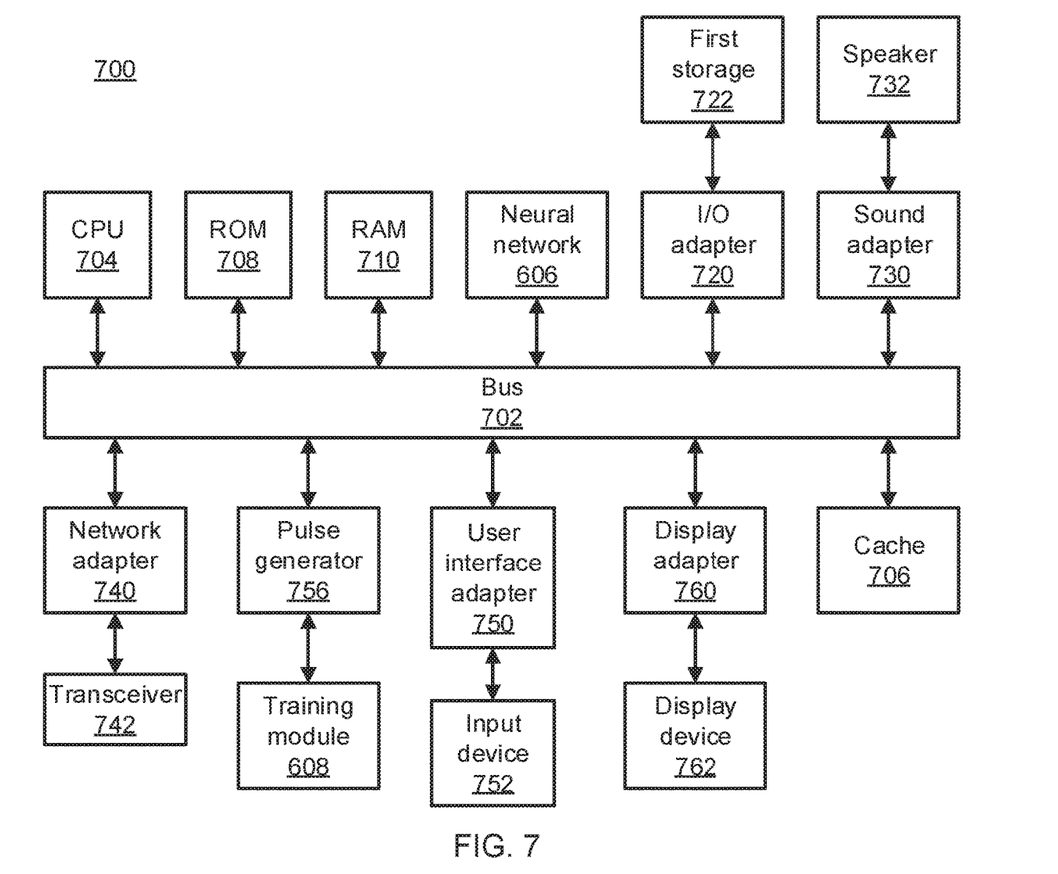
FIG. 7 is a block diagram of a processing system in accordance with an embodiment of the present invention.

Referring now to FIG. 7, an exemplary processing system 700 is shown which may represent the bidirectional RPU neural network processing system 600. The processing system 700 includes at least one processor (CPU) 704 operatively coupled to other components via a system bus 702. A cache 706, a Read Only Memory (ROM) 708, a Random Access Memory (RAM) 710, an input/output (I/O) adapter 720, a sound adapter 730, a network adapter 740, a user interface adapter 750, and a display adapter 760, are operatively coupled to the system bus 702.

A first storage device 722 is operatively coupled to system bus 702 by the I/O adapter 720. The storage device 722 can be any of a disk storage device (e.g., a magnetic or optical disk storage device), a solid state magnetic device, and so forth. The storage device 722 can be the same type of storage device or different types of storage devices.

A speaker 732 is operatively coupled to system bus 702 by the sound adapter 730. A transceiver 742 is operatively coupled to system bus 702 by network adapter 740. A display device 762 is operatively coupled to system bus 702 by display adapter 760.

A user input device 752 is operatively coupled to system bus 702 by user interface adapter 750. The user input device 752 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input device 752 can be the same type of user input device or different types of user input devices. The user input devices 752 is used to input and output information to and from system 700.

The neural network 606 is connected to the training module 608 via bus 702 or by any other appropriate electrical communication that allows pulse generator 756 to send set and reset current pulses. The training module 608 can be connected independently to the bus 702 or can be implemented in part as software that is executed by the CPU 704.

Of course, the processing system 700 may also include other elements (not shown), as readily contemplated by one of skill in the art, as well as omit certain elements. For example, various other input devices and/or output devices can be included in processing system 700, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 700 are readily contemplated by one of ordinary skill in the art given the teachings of the present principles provided herein.

Figure 8:
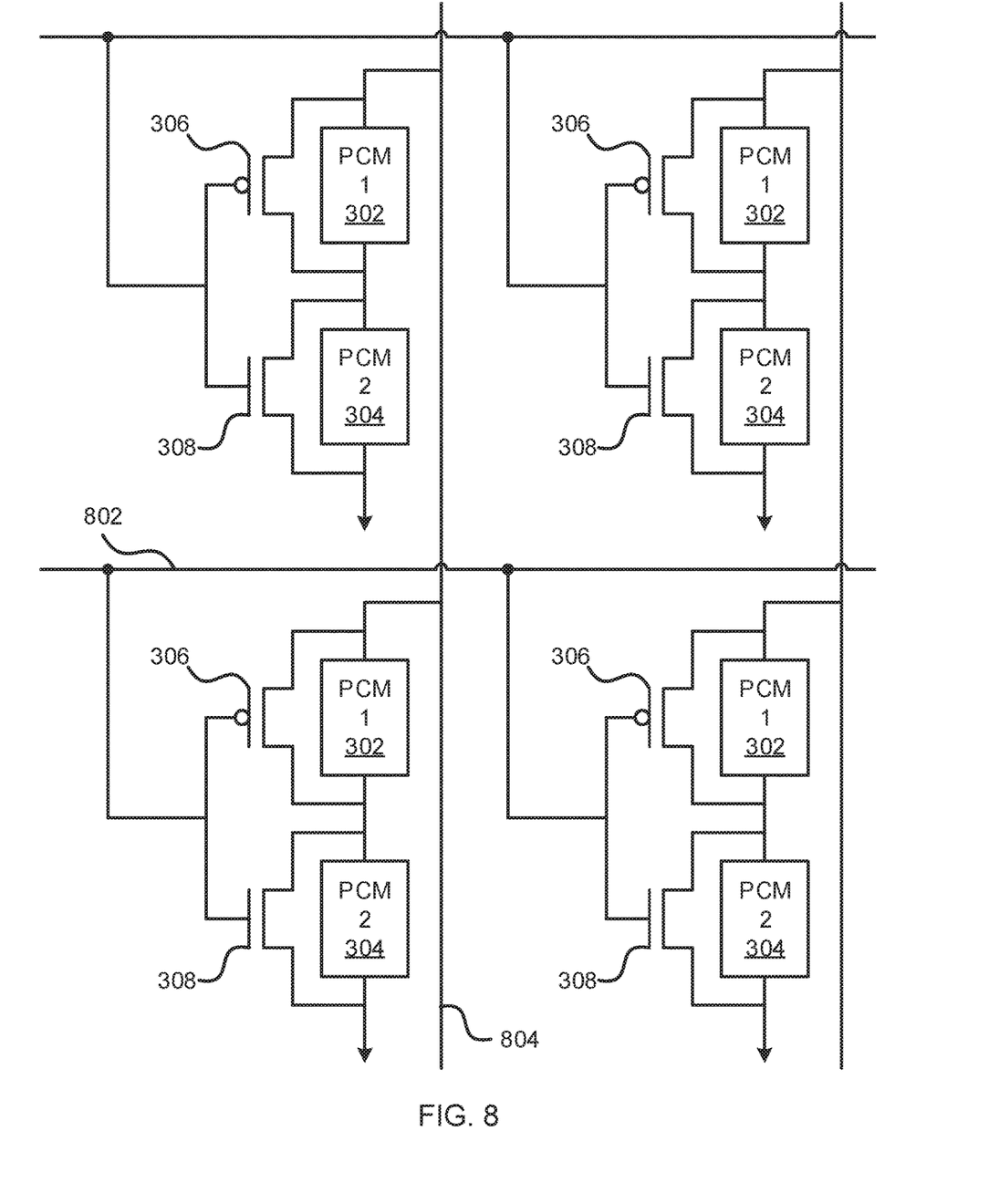
FIG. 8 is a schematic diagram of an array of resistive processing units that can be continuously changed in resistance in a positive and a negative direction in accordance with an embodiment of the present invention.

Referring now to FIG. 8, a schematic of a set of four RPUs 204 in an array are shown. The array is connected by wordlines 802 and bitlines 804. When a zero voltage along a particular wordline 802 is applied, and a small read pulse is applied on the bitline 804, both switches 306 and 308 in each RPU 204 in the wordline would be open. In this state a current will flow through both of the PCMs 302 and 304 in attached RPUs 204 in series to enable a readout of the total RPU 204 resistance. In contrast, when a positive voltage (e.g., larger than FET 308 threshold voltage) is applied on a wordline 802 and a positive set pulse is applied on bitline 804, switch 308 will be open while switch 306 will be closed, and the set current will be passing through PCM cell 302. A set or reset pulse along the bitline 804 will then cause a change in the resistance of the PCM cell 302, thereby causing a change in the series resistance of the overall RPU 204. When a negative voltage (e.g., larger than FET 306 threshold voltage) is applied on a wordline 802 and a set pulse is applied on bitline 804, switch 306 will be open while switch 308 will be closed, and the set current will passing through PCM cell 304.

Having described preferred embodiments of a symmetric phase change memory devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

Having thus described aspects of the invention, with the details and particularity required by the patent laws, what is claimed and desired protected by Letters Patent is set forth in the appended claims:

1. A variable resistance device, comprising:
a first phase change memory device connected to a bitline, comprising a first material that increases resistance when a set pulse is applied; and
a second phase change memory device connected to the bitline in series with the first phase change memory device, comprising a second material, different from the first material, that decreases resistance when a set pulse is applied.

2. The variable resistance device of claim 1, further comprising a first bypass switch configured to short-circuit the first phase change memory device when enabled and a second bypass switch configured to short-circuit the second phase change memory device when enabled.

3. The variable resistance of claim 2, wherein the first bypass switch and the second bypass switch are both disabled by default.

4. The variable resistance device of claim 2, wherein the first bypass switch is an n-type field effect transistor and wherein the second bypass switch is a p-type field effect transistor.

5. The variable resistance device of claim 1, wherein the first material is $Cr_2Ge_2Te_6$ and the second material is selected from the group consisting of GeTe, $Sb_2Te_3$, and $Ge_2Sb_2Te_5$.

6. A neural network processing system, comprising:
a first layer of one or more first neurons;
a second layer of one or more second neurons;
an array of weights that accepts a voltage output by the first layer and outputs a current to the second layer, wherein each weight in the array of weights includes:
a first phase change memory device connected to a bitline, comprising a first material that increases resistance when a set pulse is applied; and
a second phase change memory device connected to the bitline in serial with the first phase change memory device, comprising a second material, different from the first material, that decreases resistance when a set pulse is applied.

7. The neural network processing system of claim 6, further comprising a first bypass switch configured to short-circuit the first phase change memory device when enabled and a second bypass switch configured to short-circuit the second phase change memory device when enabled.

8. The neural network processing system of claim 7, wherein the first bypass switch is an n-type field effect transistor and wherein the second bypass switch is a p-type field effect transistor.

9. The neural network processing system of claim 7, wherein the control lines to the first bypass switch and the second bypass switch are connected to a wordline.

10. The neural network processing system of claim 6, wherein the first material is $Cr_2Ge_2Te_6$ and the second material is selected from the group consisting of GeTe, $Sb_2Te_3$, and $Ge_2Sb_2Te_5$.

11. The neural network processing system of claim 6, further comprising a training module configured to adjust a resistance value of each weight in the array of weights.

12. The neural network processing system of claim 11, wherein the training module is further configured to increase a resistance value of a weight in the array of weights by applying a set pulse to the first phase change memory device.

13. The neural network processing system of claim 12, wherein the training module is further configured to bypass the second phase change memory device when increasing the resistance value of the weight.

14. The neural network processing system of claim 11, wherein the training module is further configured to decrease a resistance value of a weight in the array of weights by applying a set pulse to the second phase change memory device.

15. The neural network processing system of claim 14, wherein the training module is further configured to bypass the first phase change memory device when decreasing the resistance value of the weight.

16. A neural network processing system, comprising:
a first layer of one or more first neurons;

a second layer of one or more second neurons;

an array of weights that accepts a voltage output by the first layer and outputs a current to the second layer, wherein each weight in the array of weights includes:

a first phase change memory device, comprising a first material that increases resistance when a set pulse is applied;

a second phase change memory device, comprising a second material, different from the first material, that decreases resistance when a set pulse is applied, wherein the first phase change memory device and the second phase change memory device are connected in series to a bitline;

a first bypass switch configured to short-circuit the first phase change memory device when enabled; and a second bypass switch configured to short-circuit the second phase change memory device when enabled, wherein control lines to the first bypass switch and the second bypass switch are connected to a wordline.

17. The neural network processing system of claim 16, wherein the first material is $Cr_2Ge_2Te_6$ and the second material is selected from the group consisting of GeTe, $Sb_2Te_3$, and $Ge_2Sb_2Te_5$.

18. The neural network processing system of claim 16, further comprising a training module configured to increase a resistance value of a weight in the array of weights by applying a set pulse to the first phase change memory device and to decrease a resistance value of a weight in the array of weights by applying a set pulse to the second phase change memory device.

* * * * *